(12) United States Patent
Ishikawa et al.

(10) Patent No.: US 8,588,711 B2
(45) Date of Patent: Nov. 19, 2013

(54) TRANSMISSION APPARATUS AND DISTORTION COMPENSATION METHOD

(75) Inventors: Hiroyoshi Ishikawa, Kawasaki (JP); Nobukazu Fudaba, Kawasaki (JP); Kazuo Nagatani, Kawasaki (JP); Yasuyuki Oishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 214 days.

(21) Appl. No.: 13/234,665

(22) Filed: Sep. 16, 2011

(65) Prior Publication Data

US 2012/0068768 A1 Mar. 22, 2012

(30) Foreign Application Priority Data

Sep. 21, 2010 (JP) .................. 2010-210881

(51) Int. Cl.
*H04B 1/04* (2006.01)
*H03F 1/32* (2006.01)

(52) U.S. Cl.
CPC ............ *H03F 1/3247* (2013.01); *H04B 1/0475* (2013.01)
USPC .................. 455/114.3; 455/126; 375/296

(58) Field of Classification Search
USPC .......... 455/114.2, 114.3, 115.1, 126; 375/296
See application file for complete search history.

(56) References Cited

U.S. PATENT DOCUMENTS

| 5,583,501 A * | 12/1996 | Henrion et al. ................ 341/118 |
| 5,870,668 A | 2/1999 | Takano et al. |
| 6,549,067 B1 * | 4/2003 | Kenington ....................... 330/52 |
| 7,242,247 B2 | 7/2007 | Hirose et al. |
| 7,295,819 B2 * | 11/2007 | Kenington et al. ......... 455/127.2 |
| 7,395,033 B2 * | 7/2008 | Kodani et al. .............. 455/114.3 |
| 7,653,362 B2 * | 1/2010 | Ahmed ............................ 455/91 |
| 7,907,678 B2 | 3/2011 | Mizuta et al. |
| 8,014,443 B2 * | 9/2011 | Nakamura et al. ............ 375/232 |
| 2003/0156658 A1 * | 8/2003 | Dartois ........................ 375/297 |
| 2004/0021516 A1 | 2/2004 | Oishi et al. |
| 2004/0179524 A1 | 9/2004 | Sasagawa et al. |
| 2004/0179629 A1 * | 9/2004 | Song et al. ..................... 375/296 |
| 2005/0184803 A1 | 8/2005 | Hirose et al. |
| 2005/0189990 A1 * | 9/2005 | Mizuta et al. ................... 330/52 |
| 2005/0242876 A1 * | 11/2005 | Obernosterer ................ 330/149 |
| 2006/0262880 A1 | 11/2006 | Mizuta et al. |
| 2007/0182484 A1 * | 8/2007 | Fonden et al. ................ 330/149 |
| 2008/0187035 A1 * | 8/2008 | Nakamura et al. ............ 375/232 |

FOREIGN PATENT DOCUMENTS

| JP | 9-69733 | 3/1997 |
| JP | 2005-244430 | 9/2005 |
| JP | 2006-262156 | 9/2006 |
| JP | 2006-352852 | 12/2006 |
| WO | 02/061938 | 8/2002 |
| WO | 2007/046370 | 4/2007 |

* cited by examiner

*Primary Examiner* — Duc M Nguyen
(74) *Attorney, Agent, or Firm* — Katten Muchin Rosenman LLP

(57) ABSTRACT

A transmission apparatus includes an analog digital converter that performs sampling on a demodulated signal obtained by demodulating a part of an output signal, which is produced by amplifying a modulated signal of a baseband signal including a plurality of signals having frequencies separated from each other, at a sampling frequency lower than a frequency of a given intermodulation distortion component and converting the demodulated signal into a digital signal, a detection section that detects an aliasing component of the given intermodulation distortion component produced by the conversion of the analog digital converter, and a distortion compensation section that compensates an input signal to be modulated for the given intermodulation distortion component in accordance with the detected aliasing component.

12 Claims, 10 Drawing Sheets

TRANSMISSION APPARATUS AND
DISTORTION COMPENSATION METHOD

CROSS-REFERENCE TO RELATED
APPLICATION

This application is based upon and claims the benefit of priority of the prior Japanese Patent Application No. 2010-210881, filed on Sep. 21, 2010, the entire contents of which are incorporated herein by reference.

FIELD

Embodiments discussed herein relate to a distortion compensation technique compensating distortion caused by a power amplifier of a transmission apparatus.

BACKGROUND

As a related-art technique of a distortion compensation apparatus of a power amplifier, for example, a proposal has been made of an amplifier with a distortion compensation function, which has an amplifier, a means for obtaining a difference signal between an input signal of the amplifier and an output of the amplifier, a means for generating a compensation coefficient for compensating a distortion characteristic component of the amplifier from the difference signal using an adaptive algorithm, a means for outputting the generated compensation coefficient in accordance with the input signal, and a means for multiplying the input signal by the compensation coefficient output in accordance with the input signal and inputting the result into the amplifier.

In another example of a related-art technique, a distortion compensation apparatus compensating distortion characteristic of an amplifier includes an adjacent-channel leakage power extraction means, a distortion-compensation-coefficient calculation means, and a distortion-compensation-coefficient application means. The adjacent-channel leakage power extraction means is configured to extract at least an adjacent-channel leakage power of a main channel signal to be distortion-compensated from an output signal of the amplifier. The distortion-compensation-coefficient calculation means configured to convert an amplitude value and a phase value of a distortion compensation coefficient into genotypes, respectively and to obtain the distortion compensation coefficient based on a genetic algorithm using the adjacent-channel leakage power value or an adjacent-channel leakage power rate value obtained from the adjacent-channel leakage power value as an evaluation function. And the distortion-compensation-coefficient application means is configured to apply the distortion compensation coefficient calculated by the distortion-compensation-coefficient calculation means to the input signal of the amplifier.

Also, as another example of a related-art technique of a distortion compensation apparatus of a power amplifier, a proposal has been made of a distortion-compensation amplifier in which an A/D converter samples a feedback signal of an output of a power amplifier, an equalizer of a distortion detection section detects an equalization error of a quadrature demodulated signal using an input signal of a predistorter as a reference symbol, an absolute-value averaging section outputs an average value of the equalization error in time to a control section as a distortion value, and the control section controls the predistorter adaptively based on the distortion value to perform distortion compensation.

Also, in another example of a related-art technique, a distortion-coefficient detection section 32 independently detects an amplitude third-order distortion and a phase third-order distortion constituting a coefficient related to at least third-order intermodulation distortion among coefficients related to a third-order intermodulation distortion, coefficients related to a fifth-order intermodulation distortion, and coefficients related to a seventh-order intermodulation distortion out of distortion components arising in a power amplifier from an output signal of the power amplifier and an input signal. And a distortion-compensation generation circuit generates a distortion compensation signal based on at least the detected amplitude third-order distortion and phase third-order distortion, and at least either the generated distortion-compensation signal or the input signal is passed through a variable delay filter, and then added by a multiplier.

Also, in another example of a related-art technique, a distortion-generation path of a power-series type predistorter is provided with a frequency-characteristic compensator adjusting a frequency characteristic of a distortion component in series with an odd-numbered disorder generator, a distortion detector detects a distortion component from a transmission signal obtained by demodulating an output of a power amplifier, a distortion-component frequency characteristic divider divides the distortion component by a band-width window, distortion component power is obtained for each window, and based on the power, the frequency-characteristic compensator is controlled to adjust a portion corresponding to the above-described window in the frequency characteristic of the distortion component.

Also, in another example of a related-art technique, a transmission apparatus includes a learning-signal generation section generating a learning signal, a power detection section detecting signal power of a transmission signal, and a control section obtaining appearance probability of a signal power of a transmission signal based on the signal power detected by the power detection section and adding the learning signal in accordance with the appearance probability during signal transmission.

SUMMARY

According to an aspect of the embodiments discussed herein, a transmission apparatus includes an analog digital converter that performs sampling on a demodulated signal obtained by demodulating a part of an output signal, which is produced by amplifying a modulated signal of a baseband signal including a plurality of signals having frequencies separated from each other, at a sampling frequency lower than a frequency of a given intermodulation distortion component and converting the demodulated signal into a digital signal, a detection section that detects an aliasing component of the given intermodulation distortion component produced by the conversion of the analog digital converter, and a distortion compensation section that compensates an input signal to be modulated for the given intermodulation distortion component in accordance with the detected aliasing component.

DESCRIPTION OF EMBODIMENTS

In the following, descriptions will be given of embodiments of the present disclosure with reference to the accompanying drawings.

While inventing the present embodiments, observations were made regarding the related art. Such observations include the following. In a distortion compensation apparatus, demodulation processing and analog-digital-conversion processing is performed on a part of a modulated signal amplified by a power amplifier to generate a feedback signal, and a distortion compensation coefficient is determined based on the feedback signal. In order to compensate a distortion component that appears at a given frequency, the sampling frequency of the analog-digital-conversion processing is determined so that a frequency band of the digital signal after the conversion includes a given frequency component.

Incidentally, if a plurality of signals having frequencies separated from each other are amplified by an amplifier at the same time, an intermodulation distortion component occurs on the amplified signal. For example, when two signals having frequencies F1 and F2 are amplified, a third-order intermodulation distortion component becomes a frequency component having center frequencies (2×F1−F2) and (2×F2−F1). In this manner, the frequency range in which intermodulation distortion components appear may be widened not less than three times the frequency range in which the plurality of original signals reside.

Accordingly, when distortion compensation of intermodulation distortion components is performed, a relatively high-speed sampling frequency is used in the analog digital conversion of the feedback signal. An increase in the sampling frequency results in an increase in power consumption.

At least one of the present embodiments provides a new technique for relieving an increase in the sampling frequency used for analog-digital-conversion processing of a feedback signal in distortion compensation for intermodulation distortion components.

Figure 1:
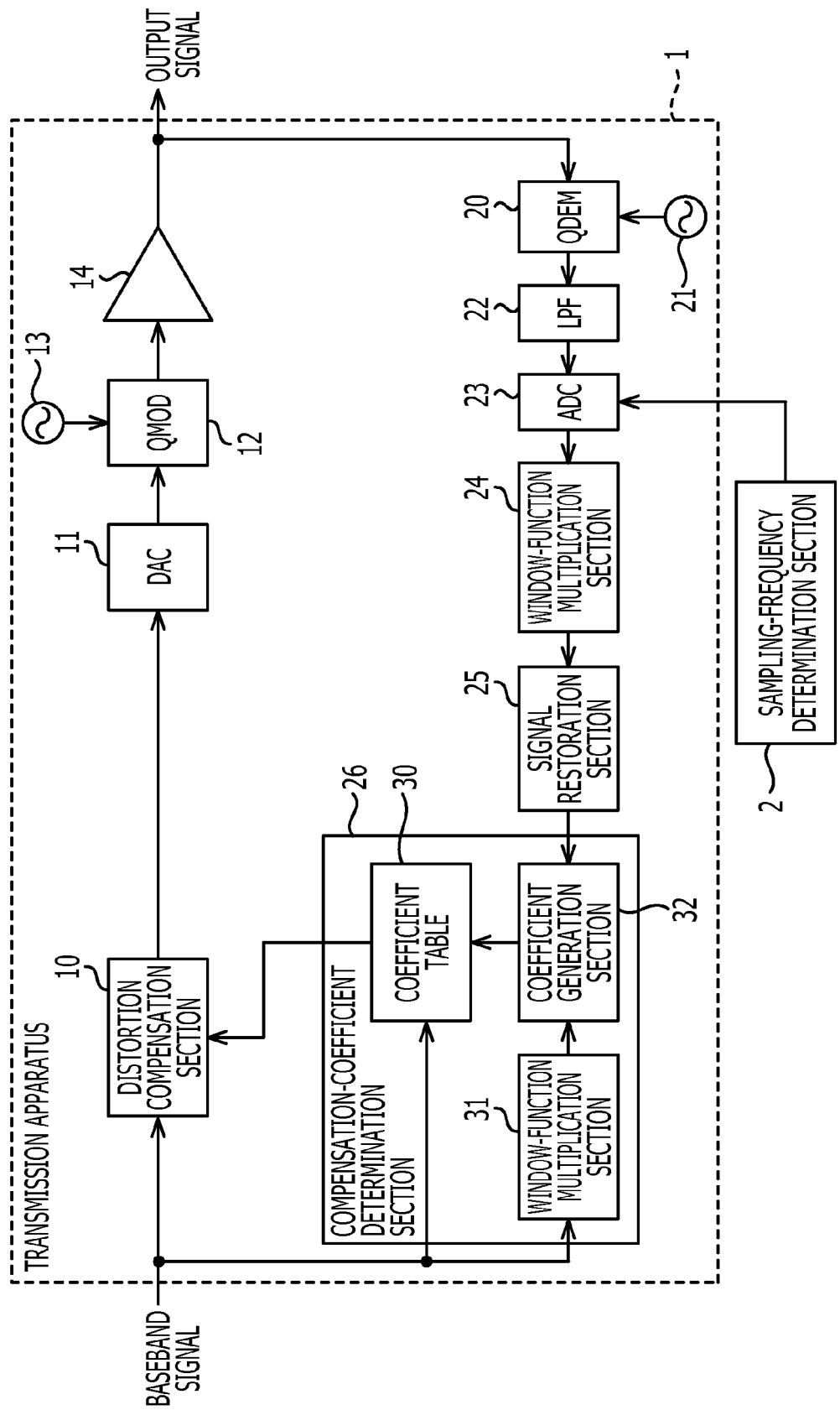
FIG. 1 is a configuration diagram illustrating a first example of a transmission apparatus.

FIG. 1 is a configuration diagram illustrating a first example of a transmission apparatus. A transmission apparatus 1 includes a distortion compensation section 10, a digital analog converter 11, a quadrature modulator 12, local-oscillator-signal generation units 13 and 21, and an amplifier 14. Also, the transmission apparatus 1 includes a quadrature demodulator 20, a low-pass filter 22, an analog digital converter 23, a window-function multiplication section 24, a signal restoration section 25, and a compensation-coefficient determination section 26.

In this regard, abbreviations are sometimes used in the following description and the drawings. That is to say, the digital analog converter is sometimes denoted by "DAC". The quadrature modulator is sometimes denoted by "QMOD". The quadrature demodulator is sometimes denoted by "QDEM". The low-pass filter is sometimes denoted by "LPF". The analog digital converter is sometimes denoted by "ADC".

The transmission apparatus 1 according to the present embodiment transmits a signal including a plurality of signals transmitted by a plurality of system carrier frequencies separated from each other. The distortion compensation section 10 receives a baseband signal to be transmitted. The baseband signal includes a plurality of signals having frequencies that are separated from each other and corresponding to a plurality of the system carrier frequencies, respectively.

Figure 2:
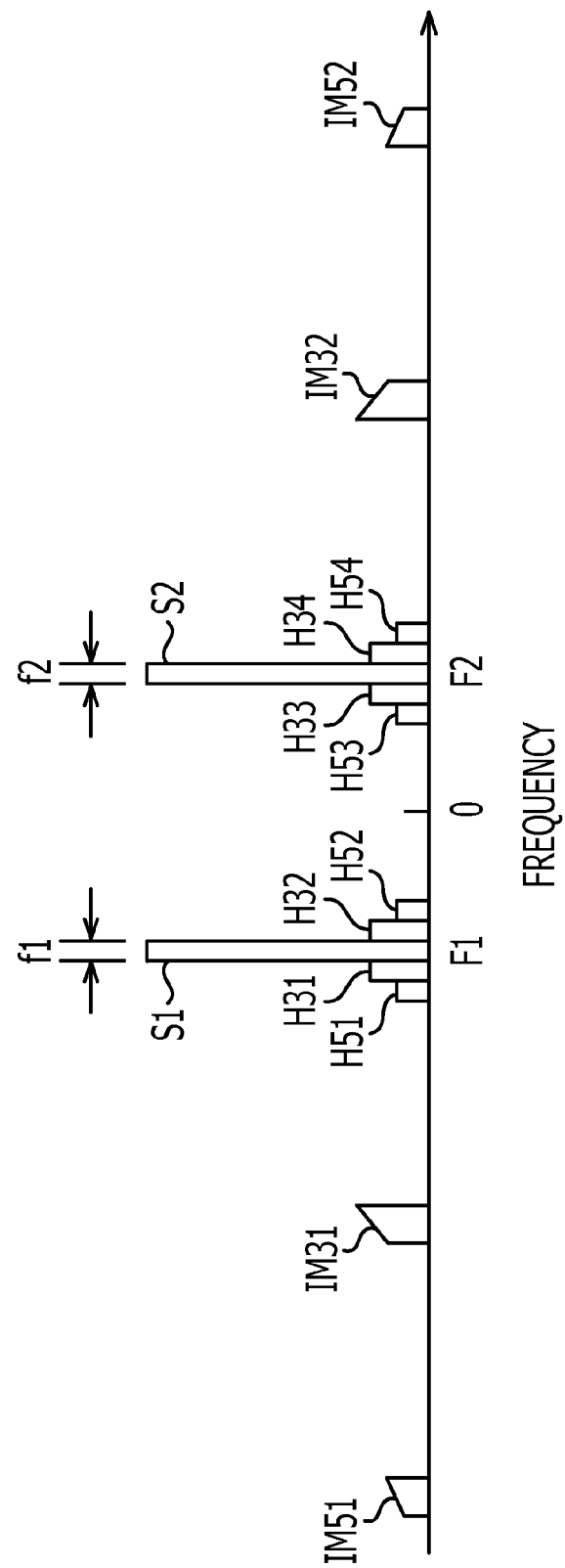
FIG. 2 is a frequency spectrum chart illustrating an example of a baseband signal.

FIG. 2 is a frequency spectrum chart illustrating an example of a baseband signal. The baseband signal includes two signals S1 and S2 corresponding to a plurality of signals, respectively, which are transmitted by two system carrier frequencies. The signals S1 and S2 are sometimes denoted by "system signals".

A center frequency and a frequency bandwidth of the system signal S1 are F1 and f1, respectively. On the other hand, a center frequency and a frequency bandwidth of the system signal S2 are F2 and f2, respectively. In this regard, the number of signals included in the baseband signal may be greater than two, and the number of signals included in the baseband signal is not limited.

Referring to FIG. 1, the distortion compensation section 10 multiplies the baseband signal by a compensation coefficient determined by the compensation-coefficient determination section 26. By multiplying the baseband signal by the compensation coefficient, an inverse characteristic to the distortion characteristic applied by the amplifier 14 is given to the baseband signal. The DAC 11 converts the baseband signal output from the distortion compensation section 10 into an analog signal.

The QMOD 12 performs quadrature modulation processing on the analog signal output from the DAC 11, and generates a modulated signal having a radio frequency. The local-oscillator-signal generation section 13 generates a local oscillator signal by which the QMOD 12 multiplies the modulated signal in the quadrature demodulation processing, and supplies the signal to the QMOD 12. The amplifier 14 amplifies the modulated signal output from the QMOD 12.

The modulated signal that has been amplified by the amplifier 14 includes harmonic distortion components and intermodulation distortion components. FIG. 2 illustrates third-order harmonic distortion components of the system signal S1 H31 and H32, third-order distortion components H33 and H34 of the system signal S2, fifth-order distortion components H51 and H52 of the system signal S1, and fifth-order distortion components H53 and H54 of the system signal S2. Also, FIG. 2 illustrates third-order intermodulation distortion components IM31 and IM32, and the fifth-order intermodulation distortion components IM51 and IM52.

In the present embodiment, the third-order intermodulation distortion components IM31 and IM32, and the fifth-order distortion intermodulation distortion components IM51 and IM52 are targeted for distortion compensation of the intermodulation distortion components. In the other embodiments, higher-order intermodulation distortion components may be targeted for the distortion compensation. Either the third-order intermodulation distortion components or the fifth-order intermodulation distortion components may be targeted for the distortion compensation. That is to say, the order number of the intermodulation distortion components to be targeted for distortion compensation is not limited.

In this regard, a center frequency of the third-order intermodulation distortion component IM31 is (2F1−F2), a lower limit of the frequency band is (2F1−F2)−(f1+f2/2), an upper limit of the frequency band is (2F1−F2)+(f1+f2/2). A center frequency of the third-order intermodulation distortion component IM32 is (2F2−F1), a lower limit of the frequency band is (2F2−F1)−(f2+f1/2), and an upper limit of the frequency band is (2F2−F1)+(f2+f1/2).

Also, a center frequency of the fifth-order intermodulation distortion component IM51 is (3F1−2F2), a lower limit of the frequency band is (3F1−2F2)−(3f1/2+f2), and an upper limit of the frequency band is (3F1−2F2)+(3f1/2+f2). A center frequency of the fifth-order intermodulation distortion component IM52 is (3F2−2F1), a lower limit of the frequency band is (3F2−2F1)−(3f2/2+f1), and an upper limit of the frequency band is (3F2−2F1)+(3f2/2+f1).

Referring to FIG. 1, the transmission apparatus 1 transmits an amplified modulated signal through an antenna. The QDEM 20 demodulates a part of the modulated signal amplified by the amplifier 14, and outputs a demodulated signal, which is a baseband signal. The local-oscillator-signal generation section 21 generates a local oscillator signal by which the QDEM 20 multiplies the demodulated signal in the quardrature demodulation processing, and supplies the local oscillator signal to the QDEM 20.

The LPF 22 passes frequency components in a frequency range including intermodulation distortion components to be targeted for distortion compensation out of the demodulated signal output from the QDEM 20. In place of the LPF 22, a band-pass filter that passes a frequency range including the system signal and intermodulation distortion components to be targeted for compensation in a preceding stage of the QDEM 20 may be used.

The ADC 23 samples the output signal of the LPF 22 at a sampling frequency Sf, and converts the signal into a digital signal. The sampling frequency Sf is set to a frequency lower than the frequency positions of the given intermodulation distortion components to be compensated. That is to say, the ADC 23 performs under sampling on frequencies of the given intermodulation distortion components. Accordingly, aliasing components of the given intermodulation distortion components appear on the output signal of the ADC 23.

Figure 3:
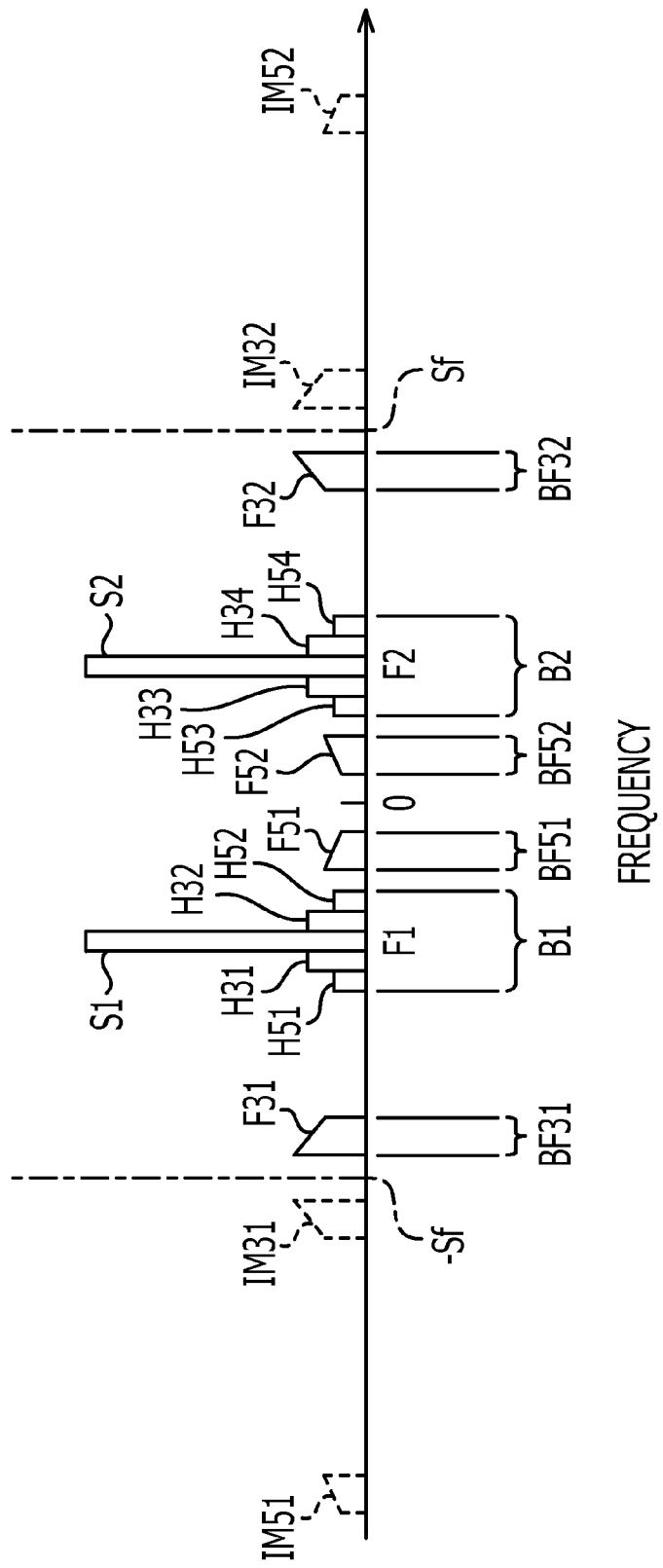
FIG. 3 is a frequency spectrum chart illustrating an example of a signal after analog digital conversion.

FIG. 3 is a frequency spectrum chart illustrating an example of a signal after analog digital conversion. An aliasing component of an intermodulation distortion component that arises by sampling at a sampling frequency Sf appears at a symmetrical position to the frequency position of an original intermodulation distortion component with respect to the sampling frequency Sf.

In the example shown in FIG. 3, the sampling frequency Sf is lower than the frequency position of the third-order intermodulation distortion component. As a result, the aliasing component F31 of the third-order intermodulation distortion component IM31 appears at a symmetrical position to the third-order intermodulation distortion component IM31 with respect to the frequency (−Sf). The aliasing component F32 of the third-order intermodulation distortion component IM32 appears at a symmetrical position to the intermodulation distortion component IM32 with respect to the frequency (Sf).

Also, the aliasing component F51 of the fifth-order intermodulation distortion component IM51 appears at a symmetrical position to the fifth-order intermodulation distortion component IM51 with respect to the frequency (−Sf). The aliasing component F52 of the fifth-order intermodulation distortion component IM52 appears at a symmetrical position to the fifth-order intermodulation distortion component IM52 with respect to the frequency (Sf).

In this regard, in the other embodiments, the sampling frequency Sf may be set at a higher position than the frequency position of the third-order intermodulation distortion component, and at a lower position than the frequency position of the fifth-order intermodulation distortion component. That is to say, the sampling frequency Sf ought to be lower than the frequency of the intermodulation distortion component of the upper limit order number to be compensated.

Referring to FIG. 1, the sampling frequency Sf of the sampling processing in the ADC 23 is determined by the sampling-frequency determination section 2. The sampling-frequency determination section 2 determines the sampling frequency Sf based on the frequency position of the system signal and the information of the frequency band. The transmission apparatus 1 may include the sampling-frequency determination section 2.

Also, the sampling-frequency determination section 2 may be used when the sampling frequency Sf is determined at the time of developing or producing the transmission apparatus 1. In this case, the ADC 23 uses the sampling frequency Sf determined at the time of the development or the production, and the transmission apparatus 1 may not include the sampling-frequency determination section 2.

The window-function multiplication section 24 multiplies the digital signal output from the ADC 23 by a given window function. The window function may be, for example, a cos window function, a $\cos^2$ window function, a $\cos^3$ window function, a $\cos^4$ window function, a Hanning window function, a Hamming window function, a Kaiser window function, a Blackman-Harris window function, etc.

The signal restoration section 25 restores a frequency position of an aliasing component of a given intermodulation distortion component included in the digital signal output from the window-function multiplication section 24 to the frequency position of the original intermodulation distortion component.

In the case of the example of signal disposition shown in FIG. 3, the signal restoration section 25 restores the frequency positions of the aliasing components F31, F32, F51, and F52 to the frequency positions of the intermodulation distortion components IM31, IM32, IM51, and IM52, respectively. That is to say, the signal restoration section 25 replaces the aliasing components F31, F32, F51, and F52 with the signal components of the frequency positions of the intermodulation distortion components IM31, IM32, IM51, and IM52 in the output signal to the subsequent stage, respectively.

The compensation-coefficient determination section 26 determines a compensation coefficient by which the distortion compensation section 10 multiplies the baseband signal. The compensation-coefficient determination section 26 includes a coefficient table 30, a window-function multiplication section 31, and a coefficient generation section 32.

The coefficient table 30 stores a compensation coefficient to be used in accordance with each signal level of the baseband signal. The coefficient table 30 outputs the compensation coefficient in accordance with each of the signal levels of the baseband signal to the distortion compensation section 10.

The window-function multiplication section 31 multiplies the baseband signal input into the compensation-coefficient determination section 26 by a given window function. The coefficient generation section 32 calculates a difference signal between the output signal of the window-function multiplication section 31 and the signal in which the frequency positions of the intermodulation distortion components have been restored by the signal restoration section 25. The coefficient generation section 32 calculates a compensation coefficient of each signal level based on the difference signal in accordance with an adaptive algorithm, and updates a value to be stored in the coefficient table 30.

Figure 4:
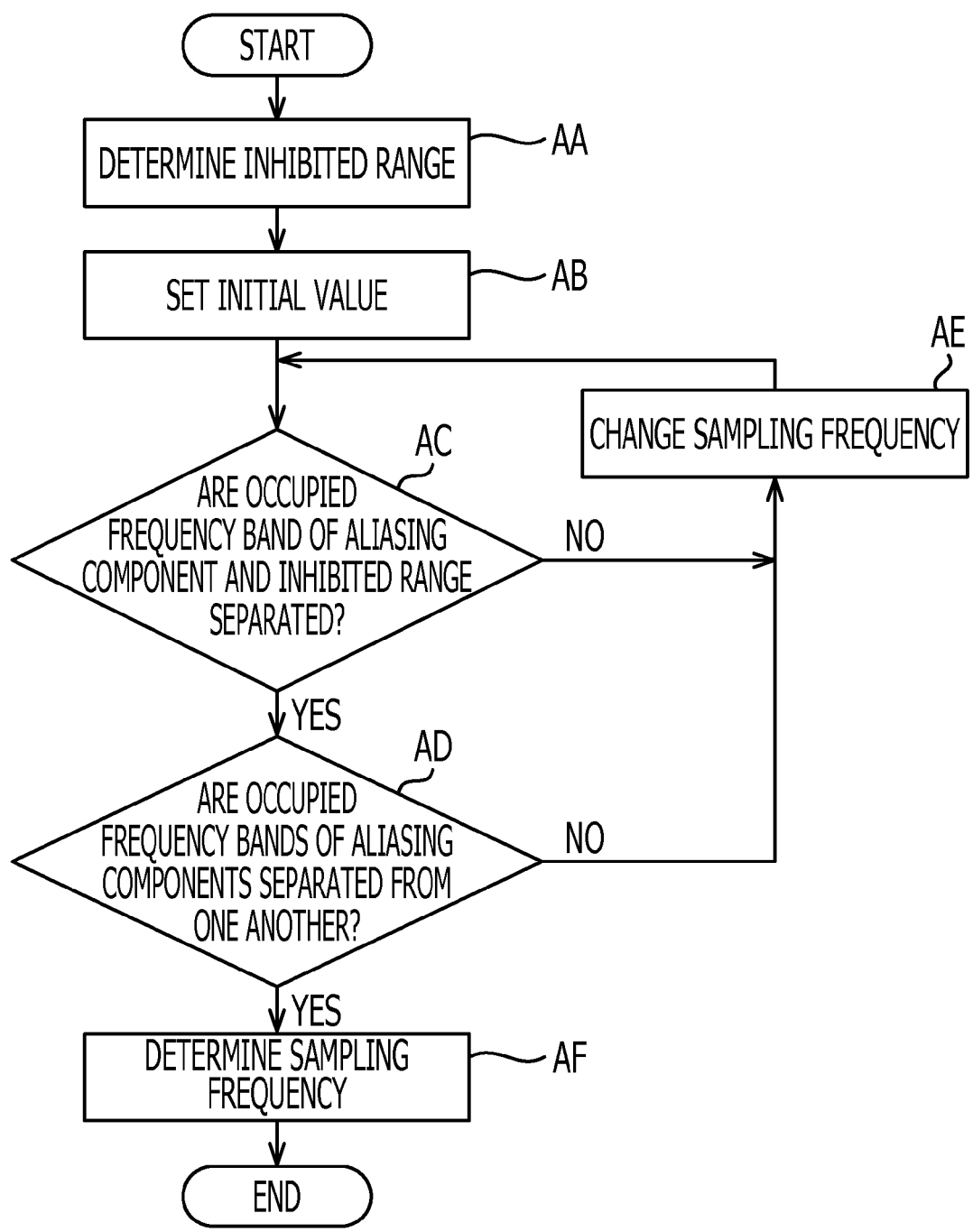
FIG. 4 is an explanatory diagram of determination processing of a sampling frequency.

Next, a description will be given of the determination processing of the sampling frequency Sf. FIG. 4 is an explanatory diagram of the determination processing of the sampling frequency Sf. In this regard, in the other embodiments, each operation of the following operations AA to AF may be a step.

In the operation AA, the sampling-frequency determination section 2 determines an inhibition range of the frequency range in which the intermodulation distortion components are inhibited from being folded by the sampling by the sampling frequency Sf. For example, the inhibition range may be frequency bands B1 and B2 shown in FIG. 3. The frequency band B1 is occupied frequency bands of the system signal S1, and the harmonic distortion components H31, H32, H51, and H52. Also, the frequency band B2 is occupied frequency bands of the system signal S2, and the harmonic distortion components H33, H34, H53, and H54.

In the other embodiments, the occupied frequency bands of the harmonic distortion components H31, H32, H33, H34, H51, H52, H53, and H54 may not be included in the inhibition range. Also, if the lower limit of the sampling frequency Sf is determined in advance, and there is an intermodulation distortion component of which aliasing component does not occur, the sampling-frequency determination section 2 may add the occupied frequency bands of the intermodulation distortion components to the inhibition range.

In operation AB, the sampling-frequency determination section 2 sets an initial value of the sampling frequency Sf. For example, in the case of the signal disposition shown in FIG. 3, the sampling-frequency determination section 2 sets, as an initial value of the sampling frequency Sf, a frequency $Sf0=(F2+5f2/2)$, which is sufficiently higher than the range between the system signals S1 and S2.

In operation AC, the sampling-frequency determination section 2 determines whether the occupied frequency bands of the aliasing components occurred when sampling is performed at the current sampling frequency Sf and the inhibition range are separated. For example, in FIG. 3, the occupied frequency bands of the aliasing components F31, F32, F51, and F52 are indicated by BF31, BF32, BF51, and BF52, respectively. The sampling-frequency determination section 2 determines whether the frequency bands BF31, BF32, BF51, and BF52 and the inhibition range are separated. If they are separated (operation AC: Y), the processing proceeds to operation AD. If they are not separated (operation AC: N), the processing proceeds to operation AE.

In operation AD, the sampling-frequency determination section 2 determines whether the occupied frequency bands of the aliasing components that occurred when sampling is performed at the current sampling frequency Sf are separated from one another. The sampling-frequency determination section 2 determines whether the frequency bands BF31, BF32, BF51, and BF52 are separated from one another. If they are separated from one another (operation AD: Y), the processing proceeds to operation AF. If they are not separated from one another (operation AD: N), the processing proceeds to operation AE.

In operation AE, the sampling-frequency determination section 2 changes the sampling frequency Sf, and the processing returns to operation AC. When the sampling frequency Sf is changed, the sampling-frequency determination section 2 may change the sampling frequency Sf by a given change step width $\Delta S$.

In operation AF, the sampling-frequency determination section 2 determines the current sampling frequency Sf to be a sampling frequency Sf to be used by the ADC 23.

In this regard, either the determination processing of the operation AC or the determination processing of the operation AD may be performed in advance of the other. Also, one of the operation AC and the operation AD may be omitted by allowing deterioration of the transmission quality in order to simplify the processing.

Figure 5:
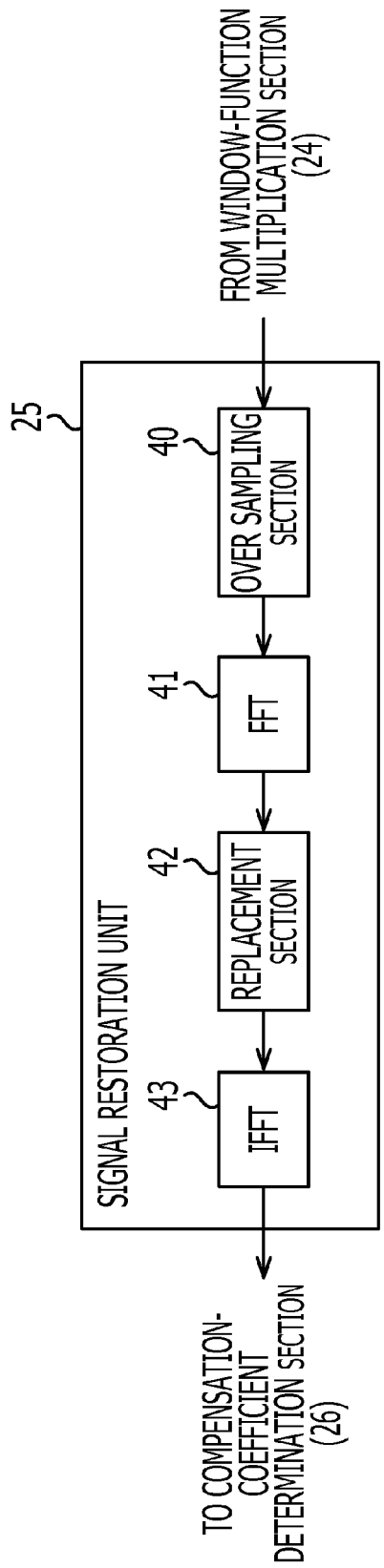
FIG. 5 is a schematic configuration diagram illustrating an example of a configuration of a signal restoration unit.

Next, a description will be given of processing by the signal restoration section 25. FIG. 5 is a schematic configuration diagram illustrating an example of a configuration of the signal restoration section 25. The signal restoration section 25 includes an over sampling section 40, a fast-Fourier-transformation section 41, a replacement section 42, and an inverse fast-Fourier-transformation section 43. In this regard, in the following description and drawings, the fast-Fourier-transformation section and the inverse fast-Fourier-transformation section are sometimes denoted by "FFT" and "IFFT", respectively.

The over sampling section 40 performs over sampling processing on the input signal of the signal restoration section 25. That is to say, the over sampling section 40 converts the input digital signal into a digital signal having a signal format handling a wider band than the signal format of the original digital signal. In the present embodiment, the over sampling section 40 converts the input signal into a digital signal handling a frequency bandwidth covering a frequency range of the intermodulation distortion component to be compensated. In this regard, the over sampling section 40 may be disposed at the subsequent stage of the FFT 41, and the embodiment may be changed so as to perform over sampling processing on the frequency-domain signal.

The FFT 41 converts the signal having been subjected to the over sampling processing by the over sampling section 40 into a frequency-domain signal. The replacement section 42 restores a position of an aliasing component of the intermodulation distortion component to be compensated to the original position of the intermodulation distortion component in the frequency-domain signal output from the FFT 41. That is to say, the replacement section 42 replaces the aliasing component with the signal component at the position of the intermodulation distortion component.

Figure 6:
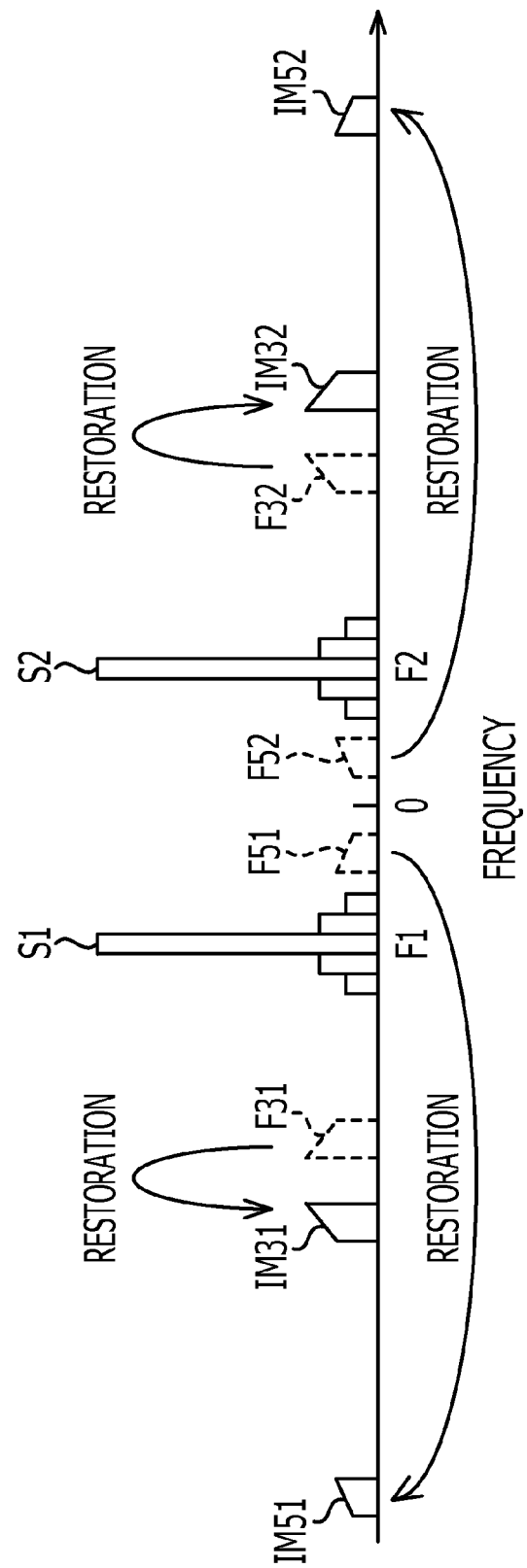
FIG. 6 is an explanatory diagram of processing of the signal restoration unit.

FIG. 6 is an explanatory diagram of processing of the signal restoration section 25. For example, in the case of the signal disposition shown in FIG. 3, the replacement section 42 restores the positions of the aliasing components F31, F32, F51, and F52 to the original positions of the intermodulation distortion components IM31, IM32, IM51, and IM52, respectively.

The IFFT 43 converts the signal restored by the replacement section 42 into a time-domain signal, and outputs the time-domain signal having the restored intermodulation distortion components to the compensation-coefficient determination section 26.

In this regard, in the present embodiment, the FFT 41 is given as an example of the detection section described in claims. Also, the replacement section 42 is given as an example of the restoration section described in claims.

By the present embodiment, the analog digital converter is allowed to perform under sampling on the intermodulation distortion components to be compensated. Accordingly, it becomes possible to perform distortion compensation of the intermodulation distortion components using the digital signal sampled at a lower sampling frequency than a sampling frequency at which the intermodulation distortion components are directly sampled. Thereby, it becomes possible to reduce power consumption of the transmission apparatus.

Figure 7:
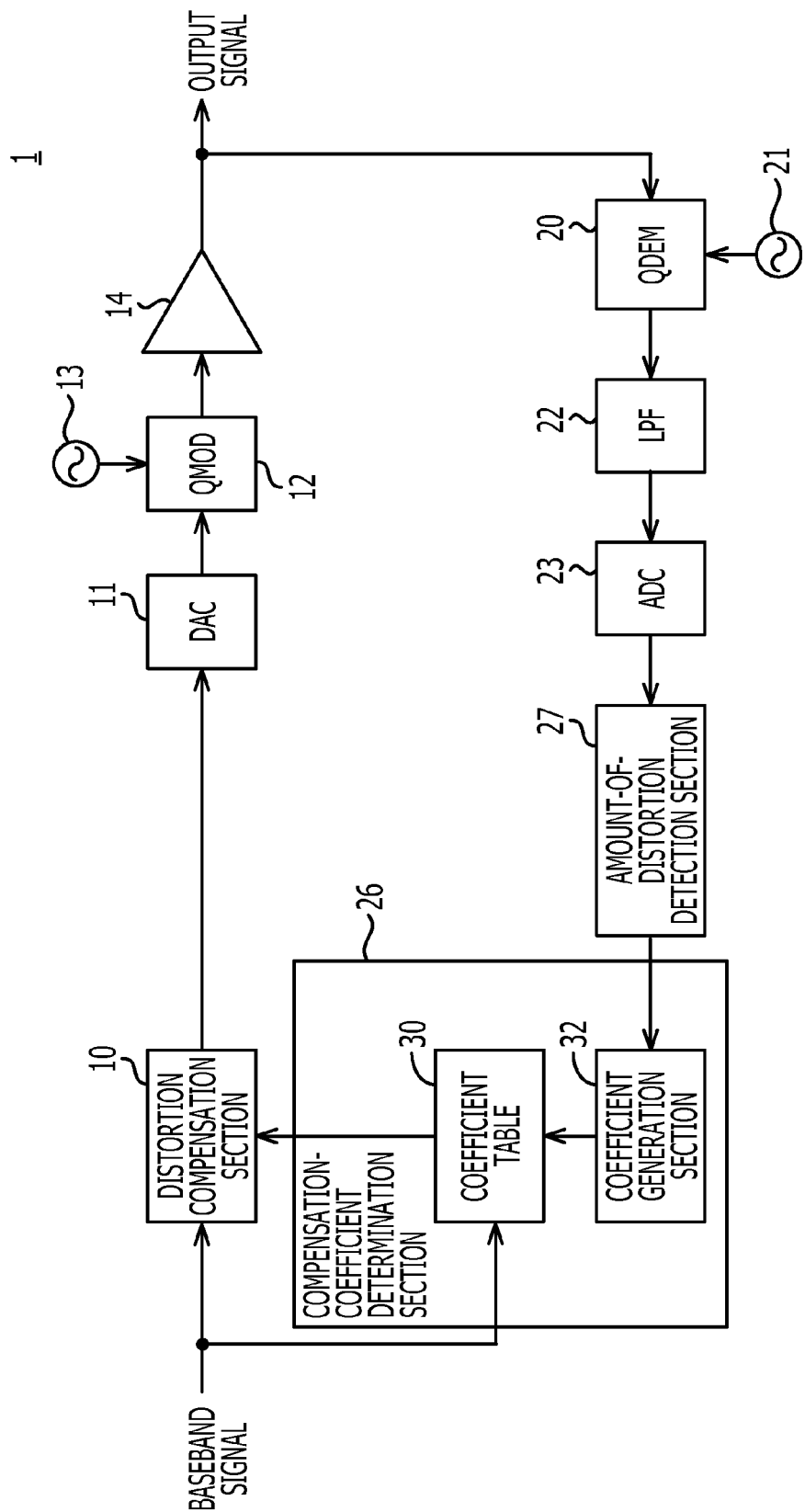
FIG. 7 is a configuration diagram illustrating a second example of a transmission apparatus.

Next, a description will be given of a transmission apparatus 1 according to another embodiment. FIG. 7 is a configuration diagram illustrating a second example of the transmission apparatus. A same reference numeral is given to a same component as that in FIG. 1, and a component having a same reference numeral performs same processing unless otherwise specifically described. The transmission apparatus 1 includes a distortion detection section 27.

The distortion detection section 27 detects a residual distortion component in a given frequency band, and outputs the amount of distortion as a scalar value. For example, the distortion detection section 27 may calculate an integration value of the signal strength detected in a given frequency band as an amount of distortion. Also, the distortion detection section 27 may calculate an amount of distortion by assigning a signal strength detected at each frequency to a given function.

Figure 8:
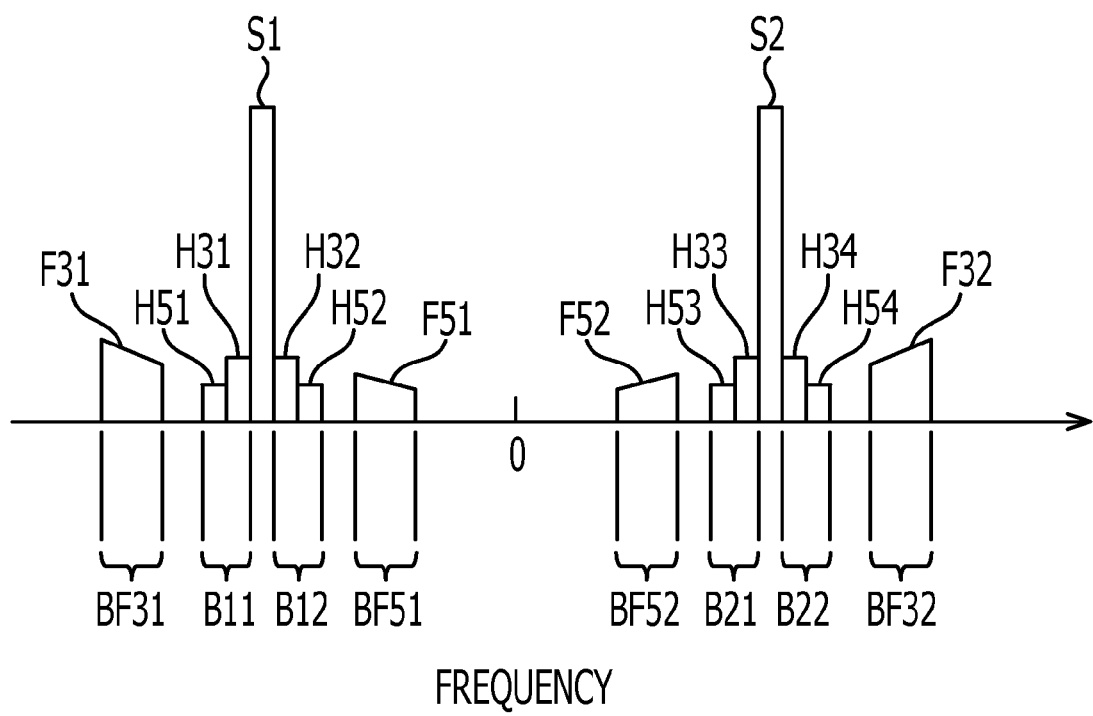
FIG. 8 is an explanatory diagram illustrating processing of a distortion detection unit.

FIG. 8 is an explanatory diagram illustrating processing of the distortion detection section 27. For example, the distortion detection section 27 may output the amount of distortion indicating the signal strengths at the frequency ranges BF31, BF32, BF51, and BF52 including aliasing components. The amount-of-distortion detection section 27 may output the sum of the amount of distortion produced by adding the signal strengths of the frequency ranges B11, B12, B21, and B22 in which harmonic distortion components occur to the amount of distortion.

Referring to FIG. 7, the coefficient generation section 32 of the compensation-coefficient determination section 26 generates a compensation coefficient based on the amount of distortion output from the distortion detection section 27. For example, the coefficient generation section 32 may generate a compensation coefficient so as to minimize the amount of distortion using any one of adaptive algorithms. The coefficient generation section 32 updates the value stored in the coefficient table 30 by the calculated compensation coefficient.

By the present embodiment, in a distortion compensation apparatus performing distortion compensation using a scalar value of distortion, when an intermodulation distortion component is compensated, the analog digital converter is allowed to perform under sampling. Also, the amount of distortion is calculated by detecting an aliasing component so that it is possible to omit processing for restoring an intermodulation distortion component.

Figure 9A:
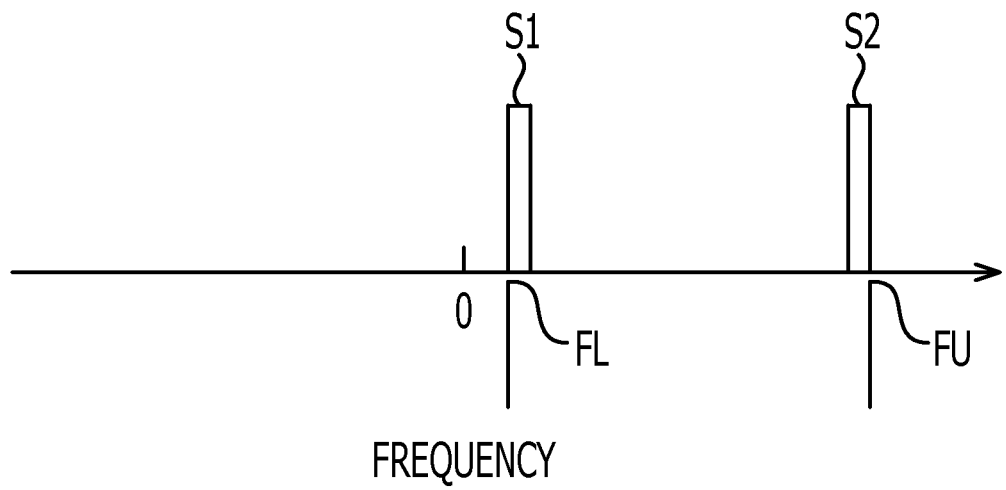
FIG. 9A and FIG. 9B are explanatory diagrams illustrating a method of determining a frequency of a local oscillator signal.

Next, a description will be given of a method of determining a frequency of the local oscillator signal generated by the local-oscillator-signal generation section 21. The positions of the system signals S1 and S2, which are input into the ADC 23 are sometimes not symmetrical with respect to the frequency 0 Hz. Such a state is shown in FIG. 9A. For example, such a signal disposition is brought about in the case where the positions of the system signals S1 and S2 that are modulated by the QMOD 12 are not symmetrical with respect to the frequency 0 Hz.

Figure 9B:
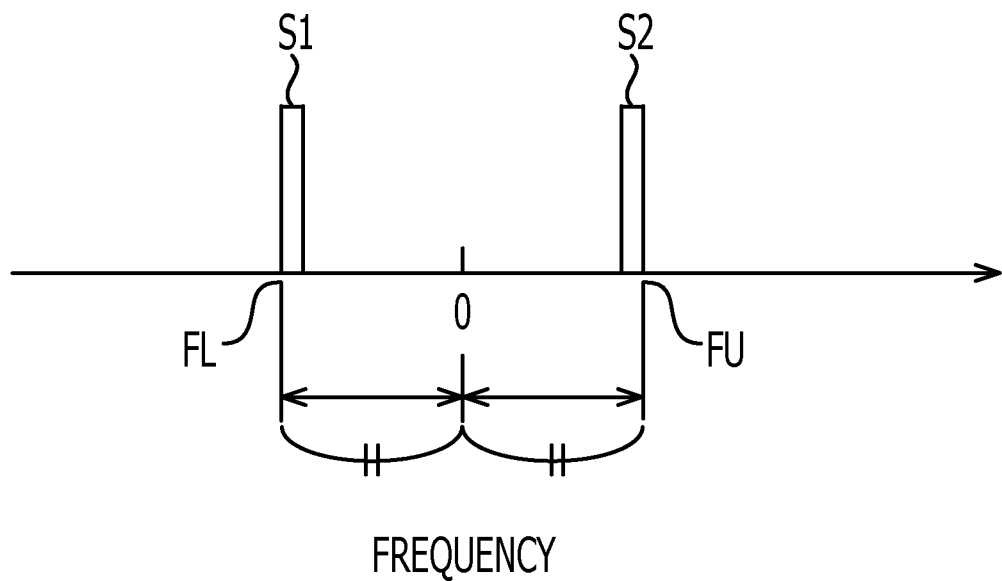

In this case, the frequency of the local oscillator signal by which the signal to be demodulated is multiplied in the QDEM 20 is adjusted so that the positions of the system signals S1 and S2 included in the modulated signal become symmetrical with respect to the frequency 0 Hz as shown in FIG. 9B. The transmission apparatus 1 may include a local-oscillator-signal adjustment section adjusting the frequency of the local oscillator signal as described above in accordance with the frequency positions and the bandwidth of the system signals S1 and S2. When the frequency of the local oscillator signal is adjusted in order to change the positions of the system signals S1 and S2, the signal restoration section 25 may perform processing for returning the frequency positions back to the original positions.

In this manner, by adjusting the positions of the system signals S1 and S2 that are input into the ADC 23, it is possible to reduce sampling frequency Sf. In FIG. 9B, a frequency FL is a lower limit of the occupied frequency band of the system signal S1, and the frequency FU is an upper limit of the occupied frequency band of the system signal S2.

Figure 10:
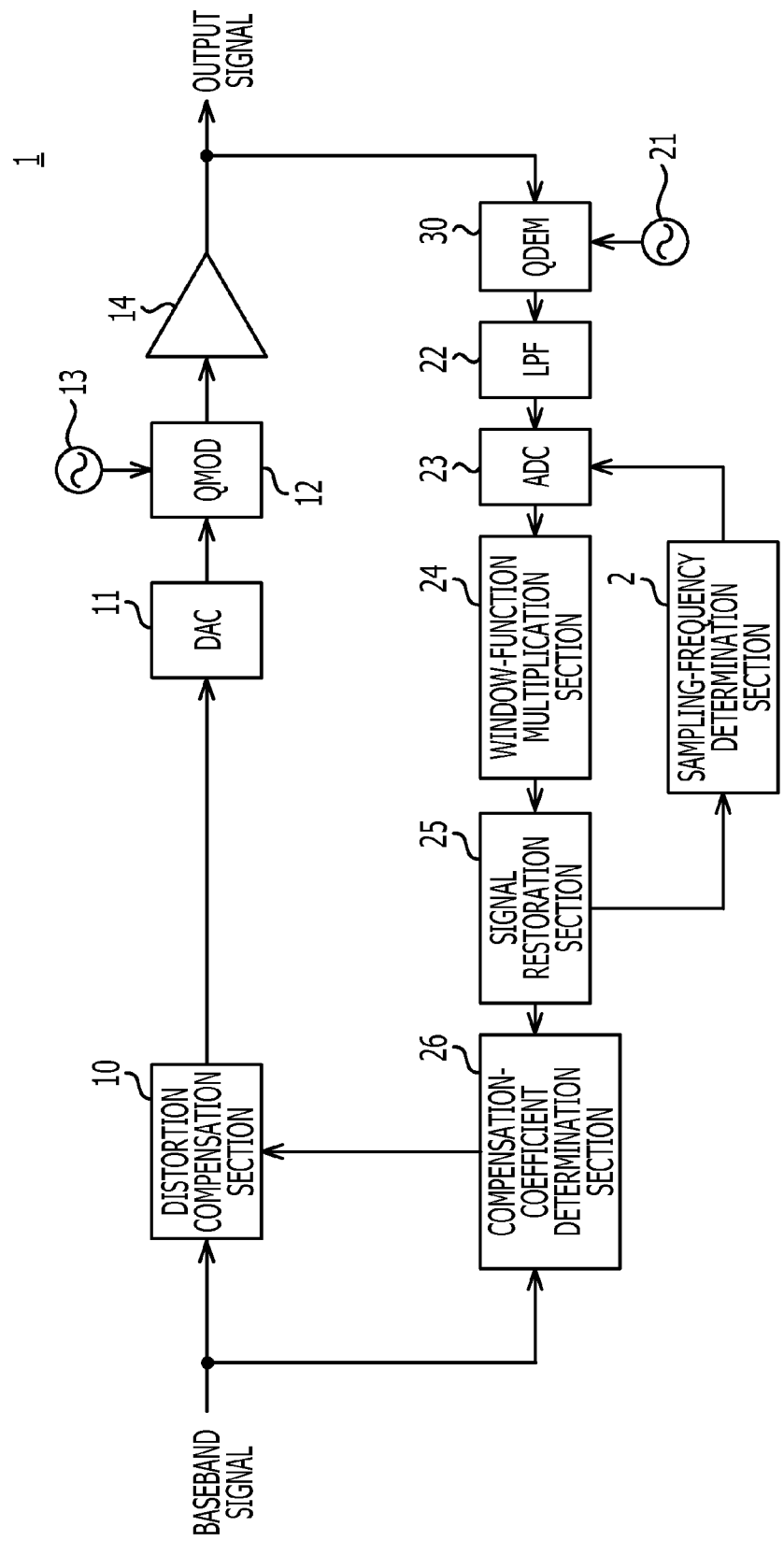
FIG. 10 is a configuration diagram illustrating a third example of a transmission apparatus.

Next, a description will be given of a transmission apparatus 1 according to another embodiment. FIG. 10 is a configuration diagram illustrating a third example of the transmission apparatus. A same reference numeral is given to a same component as that in FIG. 1, and a component having a same reference numeral performs same processing unless otherwise specifically described.

The signal restoration section 25 calculates a residual amount of distortion in the occupied frequency band of the aliasing component based on the result of frequency analysis by the FFT 41, and outputs the amount to the sampling-frequency determination section 2. The signal restoration section 25 may output the sum of the residual amount of distortion in the frequency range in which aliasing components occur and the residual amount of distortion in the frequency range in which harmonic distortion components occur.

The sampling-frequency determination section 2 readjusts the sampling frequency of the ADC 23 based on the amount of distortion calculated by the signal restoration section 25. For example, the sampling-frequency determination section 2 may adjust the sampling frequency so as to minimize the amount of distortion using any one of adaptive algorithms.

The transmission apparatus 1 may include a sampling-frequency determination section 2. Also, the sampling-frequency determination section 2 may adjust the sampling frequency Sf at the time of training when the transmission apparatus 1 is developed or produced. In this case, the transmission apparatus 1 may not include the sampling-frequency determination section 2.

By the present embodiment, when a sampling frequency that has been determined based on the frequency information of a system signal is not best suited by the influence of system spurious components, etc., it becomes possible to reduce residual distortion, and to improve the signal quality.

As described above, by an apparatus or a method according to the present disclosure, in distortion compensation for intermodulation distortion components, it is possible to relieve an increase in the sampling frequency used for the analog-digital-conversion processing of a feedback signal.

All examples and conditional language recited herein are intended for pedagogical purposes to aid the reader in understanding the invention and the concepts contributed by the inventor to furthering the art, and are to be construed as being without limitation to such specifically recited examples and conditions. Although the embodiments of the present invention have been described in detail, it should be understood that the various changes, substitutions, and alterations could be made hereto without departing from the spirit and scope of the invention.

What is claimed is:

1. A transmission apparatus comprising:
   an analog digital converter configured to perform sampling at a sampling frequency on a demodulated signal obtained by demodulating a part of an output signal, converting the demodulated signal into a digital signal, the output signal being produced by amplifying a modulated signal of a baseband signal including a plurality of signals having frequencies separated from each other and the sampling frequency being lower than a frequency of a given intermodulation distortion component, and separating a frequency band occupied by an aliasing component of the given intermodulation distortion component from at least one of a frequency band occupied by the baseband signal and a frequency band occupied by an aliasing component of an intermodulation distortion component other than the given intermodulation distortion component;
a detection circuit configured to detect the aliasing component of the given intermodulation distortion component produced by the converting of the analog digital converter; and
a distortion compensation circuit configured to compensate an input signal to be modulated for the given intermodulation distortion component in accordance with the detected aliasing component.

2. The transmission apparatus according to claim 1, further comprising:
a compensation-coefficient generation circuit configured to generate a compensation coefficient for compensating the given intermodulation distortion component in accordance with the detected aliasing component,
wherein the distortion compensation circuit multiplies the input signal by the compensation coefficient.

3. The transmission apparatus according to claim 2,
wherein the compensation-coefficient generation circuit includes:
a restoration section that restores a frequency position of the aliasing component to a frequency position of the given intermodulation distortion component; and
a coefficient generation section that generates the compensation coefficient based on a difference signal between the signal having the restored frequency position of the given intermodulation distortion component and the input signal.

4. The transmission apparatus according to claim 2,
wherein the compensation-coefficient generation circuit includes:
an amount-of-distortion detection section that detects an amount of residual distortion including a residual distortion component at a frequency position of the aliasing component; and
a coefficient generation section that generates the compensation coefficient based on the amount of residual distortion.

5. The transmission apparatus according to claim 1, further comprising:
a local-oscillator-signal generation circuit configured to generate a local oscillator signal to be used for multiplying the demodulated signal in the demodulating,
wherein a frequency of the local oscillator signal is set such that frequency positions of both ends of the plurality of signals included in the demodulated signal are disposed at regular intervals from 0 Hz.

6. The transmission apparatus according to claim 1, further comprising:
a residual-distortion detection circuit configured to detect an amount of residual distortion by performing frequency analysis on the demodulated signal; and
a sampling-frequency determination circuit configured to determine the sampling frequency minimizing the amount of the residual distortion using an adaptive algorithm.

7. A method of compensating for distortion produced by a signal amplifier, comprising:
sampling, at a sampling frequency by an analog digital converter, on a demodulated signal obtained by demodulating a part of an output signal, converting he demodulated signal into a digital signal, the output signal being produced by amplifying a modulated signal of a baseband signal including a plurality of signals having frequencies separated from each other and the sampling frequency being lower than a frequency of a given intermodulation distortion component, and separating a frequency band occupied by an aliasing component of the given intermodulation distortion component from at least one of a frequency band occupied by baseband signal and a frequency band occupied by an aliasing component of an intermodulation distortion component other than the given intermodulation distortion component;
detecting the aliasing component of the given intermodulation distortion component produced by the converting; and
compensating an input signal to be modulated for the given intermodulation distortion component in accordance with the detected aliasing component.

8. The method of compensating distortion according to claim 7, further comprising:
generating a compensation coefficient for compensating the given intermodulation distortion component in accordance with the detected aliasing component,
wherein the input signal is multiplied by the compensation coefficient in the compensating.

9. The method of compensating distortion according to claim 8,
wherein the generating of the compensation coefficient includes:
restoring a frequency position of the aliasing component to a frequency position of the given intermodulation distortion component; and
generating the compensation coefficient based on a difference signal between the signal having the restored frequency position of the given intermodulation distortion component and the input signal.

10. The method of compensating distortion according to claim 8,
wherein the generating of the compensation coefficient includes:
detecting an amount of residual distortion including a residual distortion component at a frequency position of the aliasing component; and
generating the compensation coefficient based on the amount of residual distortion.

11. The method of compensating distortion according to claim 7, further comprising:
generating a local oscillator signal to be used for multiplying the demodulated signal in the demodulating,
wherein a frequency of the local oscillator signal is set such that frequency positions of both ends of the plurality of signals included in the demodulated signal are disposed at regular intervals from 0 Hz.

12. The method of compensating distortion according to claim 7, further comprising:
detecting an amount of residual distortion by performing frequency analysis on the demodulated signal; and
determining the sampling frequency minimizing the amount of residual distortion detected using an adaptive algorithm.

* * * * *